US010489212B2

United States Patent
Smith et al.

(10) Patent No.: US 10,489,212 B2
(45) Date of Patent: Nov. 26, 2019

(54) ADAPTIVE PARALLELIZATION FOR MULTI-SCALE SIMULATION

(71) Applicant: SYNOPSYS, INC., Mountain View, CA (US)

(72) Inventors: Stephen Lee Smith, Mountain View, CA (US); Michael C. Shaughnessy-Culver, Santa Clara, CA (US); Jie Liu, San Jose, CA (US); Victor Moroz, Saratoga, CA (US); Yong-Seog Oh, Pleasanton, CA (US); Pratheep Balasingam, San Jose, CA (US); Terry Sylvan Kam-Chiu Ma, Danville, CA (US)

(73) Assignee: SYNOPSYS, INC., Mountain View, CA (US)

( * ) Notice: Subject to any disclaimer, the term of this patent is extended or adjusted under 35 U.S.C. 154(b) by 252 days.

(21) Appl. No.: 14/497,681

(22) Filed: Sep. 26, 2014

(65) Prior Publication Data

US 2015/0089511 A1    Mar. 26, 2015

Related U.S. Application Data

(60) Provisional application No. 61/883,158, filed on Sep. 26, 2013, provisional application No. 61/883,942, (Continued)

(51) Int. Cl.
  *G06F 9/46* (2006.01)
  *G06F 9/50* (2006.01)
  *G06F 17/50* (2006.01)

(52) U.S. Cl.
  CPC ........ *G06F 9/5066* (2013.01); *G06F 17/5009* (2013.01); *G06F 17/5045* (2013.01)

(58) Field of Classification Search
  CPC .................................................... G06F 9/4881
  See application file for complete search history.

(56) References Cited

U.S. PATENT DOCUMENTS

| 5,246,800 A | 9/1993 | Muray |
| 5,472,814 A | 12/1995 | Lin |
| (Continued) | | |

FOREIGN PATENT DOCUMENTS

| WO | 00-72185 A2 | 11/2000 |
| WO | 01-08028 A2 | 2/2001 |
| WO | 02-058158 A2 | 7/2002 |

OTHER PUBLICATIONS

Ayyadi et al., Semiconductor Simulations Using a Coupled Quantum Drift-Diffusion Schrodinger-Poisson Model, Aug. 12, 2004, Vienna University of Technology.*

(Continued)

*Primary Examiner* — Bing Zhao
(74) *Attorney, Agent, or Firm* — Haynes Beffel & Wolfeld LLP

(57) ABSTRACT

Roughly described, a task control system for managing multi-scale simulations receives a case/task list which identifies cases to be evaluated, at least one task for each of the cases, and dependencies among the tasks. A module allocates available processor cores to at least some of the tasks, constrained by the dependencies, and initiates execution of the tasks on allocated cores. A module, in response to completion of a particular one of the tasks, determines whether or not the result of the task warrants stopping or pruning tasks, and if so, then terminates or prunes one or more of the uncompleted tasks in the case/task list. A module also re-allocates available processor cores to pending not-yet-executing tasks in accordance with time required to (Continued)

complete the tasks and constrained by the dependencies, and initiates execution of the tasks on allocated cores.

21 Claims, 7 Drawing Sheets

Related U.S. Application Data filed on Sep. 27, 2013, provisional application No. 61/888,944, filed on Oct. 9, 2013.

(56) References Cited

U.S. PATENT DOCUMENTS

| | | | |
|---|---|---|---|
| 5,702,847 A | 12/1997 | Tarumoto et al. | |
| 6,057,063 A | 5/2000 | Liebmann et al. | |
| 6,096,458 A | 8/2000 | Hibbs | |
| 6,685,772 B2 | 2/2004 | Goddard, III et al. | |
| 7,448,022 B1* | 11/2008 | Ram | G06F 8/00 717/120 |
| 7,756,687 B2 | 7/2010 | Hwang et al. | |
| 8,112,231 B2 | 2/2012 | Samukawa | |
| 8,434,084 B2* | 4/2013 | Ferdous | G06F 9/5044 709/203 |
| 8,453,102 B1 | 5/2013 | Pack et al. | |
| 8,454,748 B2 | 6/2013 | Iwaki et al. | |
| 8,555,281 B1* | 10/2013 | van Dijk | G06F 9/4881 718/100 |
| 8,572,523 B2 | 10/2013 | Tuncer et al. | |
| 8,626,480 B2 | 1/2014 | Chang et al. | |
| 8,871,670 B2 | 10/2014 | Seebauer | |
| 9,727,675 B2 | 8/2017 | Liu et al. | |
| 9,922,164 B2 | 3/2018 | Chennamsetty et al. | |
| 9,983,979 B1* | 5/2018 | Dolinsky | G06F 11/3664 |
| 2002/0142495 A1 | 10/2002 | Usujima | |
| 2003/0217341 A1 | 11/2003 | Rajsuman et al. | |
| 2003/0217343 A1 | 11/2003 | Rajsuman et al. | |
| 2004/0063225 A1 | 4/2004 | Borden et al. | |
| 2004/0067355 A1 | 4/2004 | Yadav et al. | |
| 2004/0107056 A1 | 6/2004 | Doerksen et al. | |
| 2005/0170379 A1 | 8/2005 | Kita et al. | |
| 2005/0223633 A1 | 10/2005 | Sankaranarayanan | |
| 2005/0278124 A1 | 12/2005 | Duffy et al. | |
| 2005/0281086 A1 | 12/2005 | Kobayashi et al. | |
| 2006/0038171 A1 | 2/2006 | Hasumi et al. | |
| 2006/0101378 A1 | 5/2006 | Kennedy et al. | |
| 2007/0177437 A1 | 8/2007 | Guo | |
| 2007/0185695 A1 | 8/2007 | Neumann | |
| 2007/0265725 A1 | 11/2007 | Liu et al. | |
| 2008/0052646 A1 | 2/2008 | Tuncer et al. | |
| 2008/0147360 A1 | 6/2008 | Fejes et al. | |
| 2009/0032910 A1 | 2/2009 | Ahn et al. | |
| 2010/0052180 A1* | 3/2010 | Nguyen Hoang | H01L 21/7684 257/773 |
| 2010/0070938 A1 | 3/2010 | Wang et al. | |
| 2010/0318331 A1 | 12/2010 | Ritchie | |
| 2011/0131017 A1 | 6/2011 | Cheng et al. | |
| 2011/0161361 A1 | 6/2011 | Csanyi et al. | |
| 2011/0231804 A1 | 9/2011 | Liu et al. | |
| 2011/0246998 A1* | 10/2011 | Vaidya | G06F 9/4881 718/103 |
| 2011/0313741 A1* | 12/2011 | Langhoff | G16C 20/30 703/2 |
| 2011/0313748 A1 | 12/2011 | Li | |
| 2012/0228615 A1 | 9/2012 | Uochi | |
| 2012/0232685 A1 | 9/2012 | Wang et al. | |
| 2013/0139121 A1 | 5/2013 | Wu et al. | |
| 2014/0180645 A1 | 6/2014 | Lee et al. | |
| 2014/0251204 A1 | 9/2014 | Najmaei et al. | |
| 2015/0088473 A1 | 3/2015 | Liu et al. | |
| 2015/0088481 A1 | 3/2015 | Liu et al. | |
| 2015/0089511 A1 | 3/2015 | Smith et al. | |
| 2015/0120259 A1 | 4/2015 | Klimeck et al. | |
| 2016/0171139 A1 | 6/2016 | Tago et al. | |
| 2016/0335381 A1 | 11/2016 | Liu et al. | |

OTHER PUBLICATIONS

Ahmet Isik, Molecular Dynamics Simulation of Silicon Using Empirical Tight-Binding Method, Jan. 1992, Massachusetts Institue of Technology.*

Jacek Miloszewski, Simulations of Semiconductor Laser Using Non-equilibrium Green's Functions Method, 2012.*

Andrea Bortolossi, 3D Finite Element Drift-Diffusion Simulation of Semiconductor Devices, Jul. 25, 2014, Politecnico di Milano. (Year: 2014).*

Wang, Yan, "Multiscale Simulations", Georgia Institute of Technology, available at http://www-old.me.gatech.edu/~ywang/CANE/lect05_MultiscaleSims_yanwang.pdf, dated May 14-16, 2012, 40 pages.

Braunstein, Rubin, et al., "Intrinsic Optical Absorption in Germanium-Silicon Alloys", Physical Review, vol. 109, No. 3, Feb. 1, 1958, pp. 695-710.

Sant, Saurabh, et al., "Band gap bowing and band offsets in relaxed and strained Si1-xGex alloys by employing a new nonlinear interpolation scheme", published online Jan. 18, 2013, Journal of Applied Physics, vol. 113, pp. 033708-1 through 033708-10.

Kresse, Georg, et al., "VASP the Guide",http://cms.mpi.univie.ac.at/VASP, Sep. 9, 2013, Vienna, Austria, pp. 1-203.

Uppal, S., et al., "Diffusion of boron in germanium at 800-900° C", Journal of Applied Physics, Aug. 1, 2004, vol. 96, No. 3, pp. 1376-1380.

Haddara, Y.M., et al., "Accurate measurements of the intrinsic diffusivities of boron and phosphorus in silicon", Applied Physics Letters, Sep. 25, 2000, vol. 77, No. 13, pp. 1976-1978.

Uppal, S., et al., "Diffusion of ion-implanted boron in germanium", Journal of Applied Physics, Oct. 15, 2001, vol. 90, No. 8, p. 4293-4295.

Stadler, J., et al., "IMD: a Software Package for Molecular Dynamics Studies on Parallel Computers", International Journal of Modren Physics C, 1997, vol. 8, No. 5, pp. 1131-1140.

Refson, Keith, "Moldy: a portable molecular dynamics simulation program for serial and parallel computers", Computer Physics Communications, Apr. 11, 2000, vol. 126, issue 3, pp. 310-329.

Smith, W., et al., "DL_POLY: Application to molecular simulation", Molecular Simulation, May 5, 2002, vol. 28, Issue 5, pp. 385-471.

Smith, W., and T.R. Forester, "DL_POLY_2.0: A general-purpose parallel molecular dynamics simulation package", Journal of Molecular Graphics, Jun. 1996, vol. 14, Issue 3, pp. 136-141.

Nieminen, Risto M., "From atomistic simulation towards multiscale modelling of materials", J. Phys.: Condens. Matter, published Mar. 8, 2002, vol. 14, pp. 2859-2876.

"Simulation of Random Dopant Fluctuation Effects in TCAD Sentaurus", TCAD News, Dec. 2009, Synopsys, Mountain View, CA, USA, 4 pages.

Yu, P.Y., and M. Cardona, "2. Electronic Band Structures", Fundamentals of Seminconductors, Graduate Texts in Physics, 4th ed., Springer-Verlag Berlin Heidelberg, 2010, pp. 17-106.

"ITRS, International Technology Roadmap for Semiconductors, 2012 Update", (2012), available at http://www.itrs.net/Links/2012ITRS/2012Chapters/2012Overview.pdf, 76 pages.

"Sentaurus TCAD" datasheet, Synopsys, Inc., Mountain View, CA USA, May 2012, 4 pages.

"ITRS, 2012 Overall Roadmap Technology Characteristics (ORTC) Tables", International Technology Roadmap for Semiconductors, 2012, availalbe at http://www.itrs.net/Links/2012ITRS/2012Tables/ORTC_2012Tables.xlsm, visited Oct. 14, 2013, 39 pages.

Hansen, Stephen E., "SUPREM-III User's Manual, Version 8628", Aug. 1986, available from http://www-tcad.stanford.edu/tcad/programs/suprem3man.pdf, visited Oct. 14, 2013, 186 pages.

"Sentaurus Device" datasheet, Synopsys, Inc., Mountain View, CA, USA, Feb. 2007, 8 pages.

Martin-Bragado, Ignacio, et al., "Modeling charged defects, dopant diffusion and activation mechanisms for TCAD simulations using Kinetic Monte Carlo", Nuclear Instruments and Methods in Physics Research Sectin B: Beam Interactions with Materials and Atoms, 253:1, pp. 63-67, 2006, 18 pages.

(56) References Cited

OTHER PUBLICATIONS

Dunham, Scott T., "A Quantitative Model for the Coupled Diffusion of Phosphorus and Point Defects in Silicon", J. Electrochem. Soc., vol. 139, No. 9, Sep. 1992, pp. 2628-2636.
Skinner, Richard D., editor, "Basic Integrated Circuit Manufacturing", section 2 of "Technology Reference Manual", ICE, Integrated Circuit Engineering, 1993, 112 pages.
Nagel, L.W., and D.O. Pederson, "Spice (Simulation Program with Integrated Circuit Emphasis)", Memorandum No. ERL-M382, Electronics Research Laboratory, College of engineering, University of California, Berkeley, CA USA, Apr. 12, 1973, 65 pages.
Quarles, Thomas Linwood, "Analysis of Performance and Convergence Issues for Circuit Simulation", Memorandum No. UCB/ERL M89/42, Electronics Research Laboratory, College of Engineering, University of California, Berkeley, CA USA, Apr. 1989, 142 pages.
Dunga, Mohan V., et al., "BSIM4.6.0 MOSFET Model—User's Manual", Department of Electrical Engineering and Computer Sciences, University of California, Berkeley, CA USA, 2006, 201 pages.
Burke, Kieron, and friends, "The ABC of DFT", available at http://chem.ps.uci.edu/~kieron/dft/book/, Apr. 10, 2007, 104 pages.
Luisier, Mathieu, "Quantum Transport Beyond the Effective Mass Approximation", Diss. ETH No. 17016, 2007, 150 pages.
Taur, Y., "CMOS design near the limit of scaling", IBM J. Res. & Dev., vol. 46, No. 2/3, Mar./May 2002, 10 pages.
Luisier, Mathieu, "Quantum Transport for Engineers Lecture 4: Wave Function (WF) formalism and electrostatics", Integrated Systems Laboratory, ETH Zurich (2012), 34 pages.
Kim, Kyoung-Youm and Lee, Byoungho, "Quantum transport modeling in anisotropic semiconductors using Wigner function formulation", Proceedings Conference on Optoelectronic and Microelectronic Materials and Devices, COMMAD 2000. (2000), pp. 4.
Arovas, Daniel "Lecture Notes on Condensed Matter Physics, Chapter 1 Boltzmann Transport", Department of Physics, University of California, San Diego (2010), pp. 46.
Grau-Crespo, R. "Electronic structure and magnetic coupling in FeSbO4: A DFT study using hybrid functionals and GGA+U methods", Physical Review B 73, (2006), pp. 9.
Côté, Michel, "Introduction to DFT+U", International Summer School on Numerical Methods for Correlated Systems in Condensed Matter, Université de Montréal, [YEAR], pp. 23.
Muramatsu, A., "Quantum Monte Carlo for lattice fermions", in: M.P. Nightingale, C.J. Umriga (Eds.), Proceedings of the NATO Advanced Study Institute on Quantum Monte Carlo Methods in Physics and Chemistry, Kluwer Academic Publishers, (1999), pp. 32.
Gross, E.K.U. and Maitra, N. T., "Introduction to TDDFT", Chapter in Fundamentals of Time-Dependent Density Functional Theory, Springer-Verlag (2012), 58 pages.
Marques, M.A.L. and Gross, E.K.U., "Time-dependent density functional theory," C. Fiolhais, F. Nogueira, M.A.L. Marques (Eds.), A Primer in Density Functional Theory, Springer Lecture Notes in Physics, vol. 620, Springer (2003), pp. 144-184.
Ryndyk, D.A., "Tight-binding model", Lectures 2006-2007, Dresden University of Technology, (2006-2007), pp. 26-30.
Bank, R.E., "Numerical Methods for Semiconductor Device Simulation", IEEE Transactions on Electron Devices, vol. ED-30, No. 9, (1983), pp. 1031-1041.
Lee, J.F., "Time-Domain Finite-Element Methods", IEEE Transactions on Antenna and Propagation, vol. 45, No. 3, (1997), pp. 430-442.
Eymard, R., "Finite Volume Methods", course at the University of Wroclaw, (2008), manuscript update of the preprint 'n0 97-19 du LATP, UMR 6632, Marseille, (Sep. 1997), Handbook of Numerical Anaylsis P.G. Ciarlet, J.L. Lions, eds. vol. 7, pp. 713-1020.
Chen, X.L., "An advanced 3D boundary element method for characterizations of composite materials", Engineering Analysis with Boundary Elements 29, (2005), pp. 513-523.
Marx, D., "Ab initio molecular dynamics: Theory and Implementation", Modern Methods and Algorithms of Quantum Chemistry, J. Grotendorst (Ed.), John von Neumann Institute for Computing, Julich, NIC Series, vol. 1, (2000), pp. 150.
PCT/US2014/057707—International Search Report and Wirtten Opinion dated Dec. 29, 2014, 16 pages.
PCT/US2014/057707—International Preliminary report on Patentability, 8 pages.
PCT/US2014/057637—International Preliminary Report on Patentability dated Mar. 29, 2016, 7 pages.
U.S. Appl. No. 14/906,543—Office Acton dated Jun. 17, 2016, 26 pages.
PCT/US2014/057840—International Search Report dated Nov. 28, 2014, 9 pages.
U.S. Appl. No. 15/081,735—Office Action dated Jun. 15, 2016, 16 pages.
Saha et al., Technology CAD: Technology Modeling, Device Design and Simulation, 2004 VLSI Design Tutorial, Mubai, India, Jan. 5, 2004, 227 pages.
Kresse, G., et. al., VASP the Guide (Sep. 9, 2013), pp. 203.
U.S. Appl. No. 15/024,009—Final Office Action dated Nov. 18, 2016, 24 pages.
U.S. Appl. No. 15/081,735—Office Action dated Dec. 13, 2016, 30 pages.
PCT/US2014/057840—International Preliminary Report on Patentability dated Mar. 29, 2016, 5 pages.
U.S. Appl. No. 15/081,735—Response to Office Action dated Jun. 15, 2016 filed Nov. 15, 2016, 18 pages.
PCT/US2014/057803—International Search Report and Written Opinion dated Nov. 28, 2014, 14 pages.
U.S. Appl. No. 15/024,009—Office Action dated Jul. 21, 2016, 24 pages.
U.S. Appl. No. 15/024,009—Response to Office Action dated Jul. 21, 2016 filed Nov. 1, 2016, 38 pages.
U.S. Appl. No. 15/024,009—Preliminary Amendment filed Mar. 22, 2016, 8 pages.
PCT/US2014/057637—International Search Report and Written Opinion dated Jan. 5, 2015, 12 pages.
Bragado et al., "Modeling charged defects, dopant diffusion and activation mechanisms for TCAD simulations using Kinetic Monte Carlos," Nuclear Instruments and Methods in Physics Research Section B: Beam Interactions with Materials and Atoms, 253:1, 18 pages, Dec. 2006.
Dunham, "A Quantitative Model for the Coupled Diffusion of Phosphorus and Point Defects in Silicon," J. Electrochem. Soc. vol. 139, issue 9, Sep. 1992, 2628-2636.
Nagel, Laurence W., "SPICE2: A Computer Program to Simulate Semiconductor Circuits", Memorandum No. UCB/ERL-M520, Electronics Research Laboratory, College of Engineering, University of California, Berkeley, CA USA, (May 9, 1975), 431 pages.
Nieminen, "From atomistic simulation towards multiscale modelling of materials," J. Phys.: Condens. Matter vol. 14, No. 11, Mar. 8, 2002, pp. 2859-2876.
Synopsys, Sentaurus TCAD, Industry-Standard Process and Device Simulators, Datasheet (2012), 4 pages.
Yip, S. (ed.), Handbook of Materials Modeling, 565-588. c 2005 Springer.
U.S. Appl. No. 14/906,543—Response to Office Action dated Jun. 17, 2016 filed Dec. 19, 2016, 23 pages.
U.S. Appl. No. 14/906,543—Final Office Action dated Feb. 10, 2017, 16 pages.
U.S. Appl. No. 14/906,543—Preliminary Amendment dated Jan. 20, 2016, 8 pages.
U.S. Appl. No. 15/081,735—Response to Office Action dated Dec. 13, 2016, filed Mar. 13, 2017, 10 pages.
U.S. Appl. No. 15/081,735—Notice of Allowance dated Mar. 29, 2017, 17 pages.
Jegert, et al. "Role of Defect Relaxation for Trap-Assisted Tunneling in High-k Thin Films: A First-Principles Kinetic Monte Carlo Study." Physical Review B 85.4 (2012), 8 pages.
U.S. Appl. No. 14/497,695—Office Action dated Jul. 13, 2017, 26 pages.
U.S. Appl. No. 14/498,492—Notice of Allowance dated Aug. 14, 2017, 28 pages.

(56) References Cited

OTHER PUBLICATIONS

Clark, "Quantum Mechanics: Density Functional Theory and Practical Application to Alloys." Introduction to Compter Simulation (2010), 51 pages.
U.S. Appl. No. 14/906,543—Response to Final Office Action dated Feb. 10, 2017 filed Jun. 23, 2017, 15 pages.
U.S. Appl. No. 14/906,543—Advisory Action dated Aug. 2, 2017, 4 pages.
U.S. Appl. No. 14/498,458—Notice of Allowance dated Sep. 7, 2017, 29 pages.
U.S. Appl. No. 15/669,722—Office Action dated Oct. 6, 2017, 30 pages.
U.S. Appl. No. 15/669,722—Notice of Allowance dated Mar. 7, 2018, 5 pages.
U.S. Appl. No. 15/669,722—Response to Office Action dated Oct. 6, 2017 filed Jan. 10, 2018, 3 pages.
U.S. Appl. No. 14/497,695—Final Office Action dated May 3, 2018, 14 pages.
U.S. Appl. No. 14/497,695—Response to Office Action dated Jul. 13, 2017 filed Jan. 16, 2018, 19 pages.
U.S. Appl. No. 15/021,655—Office Action dated Apr. 19, 2018, 43 pages.
Taylor et al., "Ab initio modeling of quantum transport properties of molecular electronic devices", 2001, Physical Review B 63.24, 245407, pp. 1-13.
Sverdlov et al., "Current Transport Models for Nanoscale Semiconductor Devices," 2008, Materials Science and Engineering: R: Reports 58.6, pp. 228-270.
U.S. Appl. No. 15/224,165—Office Action dated Aug. 7, 2018, 47 pages.
U.S. Appl. No. 14/497,695—Advisory Action dated Aug. 23, 2018, 3 pages.
U.S. Appl. No. 14/497,695—Response to Final Office Action dated May 3, 2018 filed Aug. 29, 2018, 31 pages.
U.S. Appl. No. 14/497,695—Office Action dated Sep. 21, 2018, 18 pages.
U.S. Appl. No. 15/021,655—Notice of Allowance dated Nov. 7, 2018, 13 pages.
U.S. Appl. No. 15/021,655—Response to Office Action dated Apr. 19, 2018 filed Jul. 18, 2018, 17 pages.
U.S. Appl. No. 15/224,165—Response to Office Action dated Aug. 7, 2018 filed Dec. 4, 2018, 14 pages.
U.S. Appl. No. 14/497,695—Response to Office Action dated Sep. 21, 2018 filed Jan. 22, 2019, 15 pages.
U.S. Appl. No. 14/497,681—Response to Final Office Action dated May 11, 2018 filed Jul. 13, 2018, 12 pages.
U.S. Appl. No. 15/224,165—Final Office Action dated Feb. 6, 2019, 14 pages.
U.S. Appl. No. 14/497,695—Notice of Allowance dated May 13, 2019, 10 pages.
PCT/US2014/057803—International Preliminary Report on Patentability dated Mar. 29, 2016, 10 pages.
U.S. Appl. No. 14/497,695—Amendment After Allowance filed Jun. 11, 2019, 8 pages.
U.S. Appl. No. 15/021,655—Notice of Allowance dated May 1, 2019, 12 pages.
U.S. Appl. No. 15/224,165—Response to Final Office Action dated Feb. 6, 2019 filed Jun. 13, 2019, 13 pages.
Capelle, K. 2006. A bird's-eye view of density-functional theory. Braz. J. Phys., 36: 1318-1343.
Burke, The ABC of DFT, Department of Chemistry, University of California, Irvine (Apr. 10, 2007), https://dft.uci.edu/doc/g 1.pdf.
US 2006/0271301 A1, published Nov. 30, 2006, Toshikazu Takada et al., 17 pages.

\* cited by examiner

ADAPTIVE PARALLELIZATION FOR MULTI-SCALE SIMULATION

CROSS-REFERENCE TO RELATED APPLICATIONS

This application claims benefit of U.S. Provisional Patent Application No. 61/883,158 filed on Sep. 26, 2013, U.S. Provisional Patent Application No. 61/883,942 filed on Sep. 27, 2013, and U.S. Provisional Patent Application No. 61/888,944 filed on Oct. 9, 2013. Those provisional patent applications are incorporated by reference as if fully set forth herein.

BACKGROUND

This invention relates to systems and methods for optimizing turnaround time for a multi-scale simulation, where a multi-scale simulation includes different simulation approaches, each tailored to a particular domain or scale of applicability.

DESCRIPTION OF RELATED ART

Multi-scale simulation is often used to model process steps and electrical behavior of novel semiconductor materials and devices. Multi-scale simulation involves the use of different simulation approaches focused on different domains or scales of applicability. This includes ab initio approaches such as Density Functional Theory (DFT) calculations to simulate the material properties at the atomistic scale all the way to continuum approaches that model entire device structures. The computational time required for each of these different approaches varies greatly. A common approach to speed up calculations is to employ parallelization. However, due to the large differences in compute time for these different approaches, it is desired to provide methods for automatically optimizing the turnaround time of each computation approach as well as the turnaround time for the overall multi-scale system.

SUMMARY

The technology disclosed herein relates to methods for optimizing the turnaround time of multi-scale simulations. Roughly described, the technology disclosed optimizes turnaround time within each simulation approach and between simulation approaches. A particular simulation approach typically requires a sequence of multiple steps, each of which typically requires different amounts of computing resources. The technology disclosed distributes available compute resources in an adaptive and parallel way to optimize the turnaround time for each of the simulation approaches so that a single step does not become a bottleneck and limits the speed of the overall calculation. Similarly, the turnaround time for a multi-scale simulation composed of a plurality of simulation approaches is minimized adaptively by identifying the slowest approach in the sequence and automatically allocating additional compute resources.

The above summary of the invention is provided in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description that is presented later. Particular aspects of the invention are described in the claims, specification and drawings.

BRIEF DESCRIPTION OF THE DRAWINGS

The invention will be described with respect to specific embodiments thereof, and reference will be made to the drawings, in which.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

A multi-scale simulation includes different simulation approaches, each tailored to a particular domain or scale of applicability. Various data computed by a tool of a particular approach is then used by the next tool in the tool chain of the multi-scale simulation.

Figure 1:
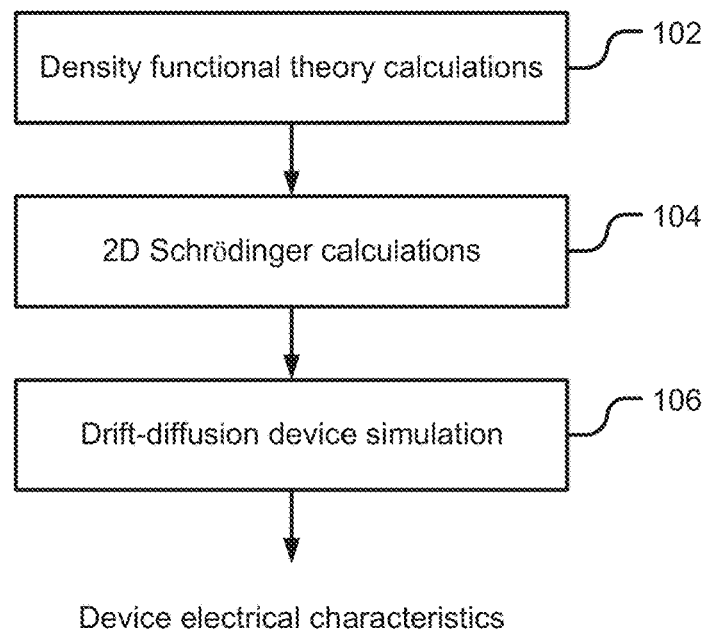
FIG. 1 illustrates a flow chart of an example multi-scale simulation for TCAD device simulation.

FIG. 1 illustrates a flow chart of an example multi-scale simulation for device simulation with a new material. The multi-scale simulation starts with a first approach in density functional theory (DFT) calculations (Block 102). DFT calculations are used to compute the band structure of a novel material or material lattice configuration in a highly confined geometry such as a FinFET or nanowire, and can require many hours or even days to execute for a single case. Various parameters such as effective mass and valley splittings are extracted and passed to the next simulation approach. The DFT calculations comprise the following steps:
  a. Specify initial position of atoms in crystal lattice based on the user-selected material
  b. Iteratively refine the parameters of the calculation to achieve a target accuracy
  c. Relax the lattice positions
  d. Compute the band structure The second approach of the multi-scale simulation is 2D Schrödinger calculations (Block 104). This approach, which is less computationally intensive than the DFT calculations but still requires many hours to execute, takes the masses and valley splittings from DFT calculations and computes the carrier density for a particular device geometry. The carrier density is then passed to the next simulation approach. The 2D Schrödinger calculations comprise the following steps:
 a. Extract a 2D cross-section from a 3D device structure
 b. Solve the Poisson equation
 c. Solve the Schrödinger eigenvalue equation
 d. Repeat b and c on iteratively refined mesh until result converges
 e. Compute the final carrier density The third approach of the multi-scale simulation is drift-diffusion device simulation (Block 106). This approach takes the carrier density computed by the 2D Schrödinger calculations and first automatically fits a compact quantum model, such as density-gradient, to the carrier density. A drift-diffusion device simulation is then performed to compute the electrical characteristics (e.g., voltage-current curves) of the device. A drift-diffusion device simulation can still take hours to complete, but is nevertheless significantly less time consuming than the 2D Schrödinger approach. The drift-diffusion device simulation comprises the following steps:
 a. Fit a compact quantum model, such as density-gradient, to the carrier density from the 2D Schrödinger calculation
 b. Perform a drift-diffusion device simulation.

One example tool implementing drift-diffusion device simulations is a TCAD (Technology Computer-Aided Design) tool such as Sentaurus Device, available from Synopsys, Inc., Mountain View, Calif.

Without automatically allocating compute resources to the different tools, the slowest tool in the tool chain of the multi-scale simulation can limit the overall throughput of the system. In addition, each tool, or simulation approach, typically requires several tasks for a calculation. These tasks can vary greatly in the amount of computing time required.

Figure 2:
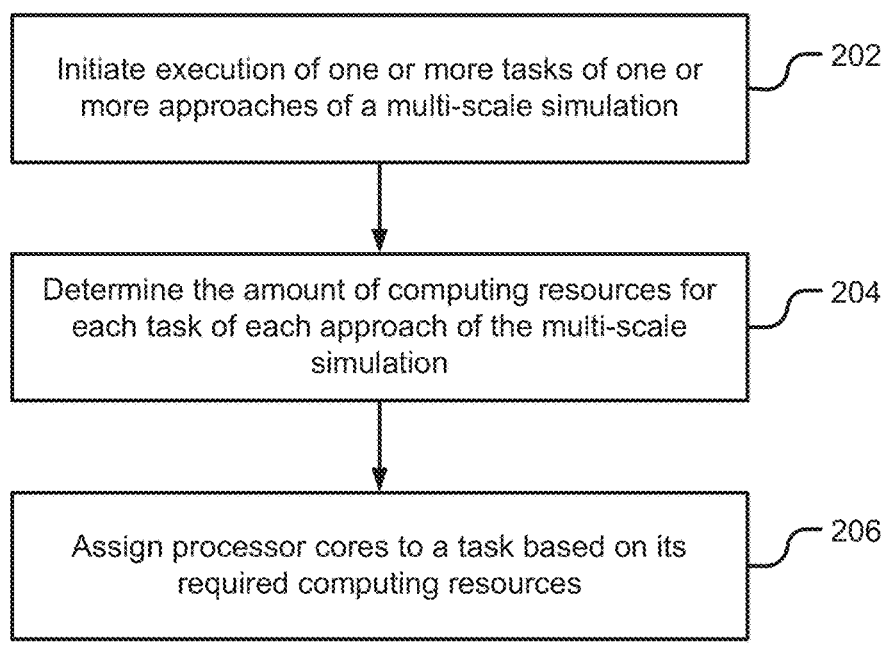
FIG. 2 illustrates a flow chart of a method for optimizing turnaround time for a multi-scale simulation, such as the TCAD multi-scale simulation illustrated in FIG. 1.

FIG. 2 illustrates a flow chart of a method for optimizing turnaround time for a multi-scale simulation, such as the multi-scale simulation illustrated in FIG. 1. The method automatically and adaptively allocates computing resources for the multi-scale simulation. The method can be implemented by one or more programs or software modules executing on one or more processors of one or more computer systems. Each processor may comprise one or more processor cores. The method starts at step 202. At step 202, a task control system initiates execution of one or more tasks of one or more approaches of a multi-scale simulation. The task control system maintains a dependency tree to maintain correct ordering in the sequence of tasks of an approach, and ordering in the sequence of approaches of the multi-scale simulation. A dependency tree includes the sequence of approaches, the tasks of each approach, the order in which each task of each approach must be performed, a list of which tasks must be completed before the next task can start, and the current completion status of each task. In some implementations, the dependency tree is represented by a directed graph data structure. Each task of the approaches of the multi-scale simulation is represented by a node in the directed graph data structure. The task control system performs the method for optimizing turnaround time for the multi-scale simulation by traversing the directed graph data structure.

At step 204, the task control system determines the amount of computing resources required for each task of each approach of the multi-scale simulation. In one embodiment, rough estimates of this information are predetermined for the task control system. In another embodiment, the task control system can monitor execution of a particular task and determine the amount of computing resource required for the particular task as the product of computing time and the number of processor cores used to complete execution of the particular task.

At step 206, the task control system automatically assigns processor cores to a task based on its required computing resources. For example, the task control system can assign more processor cores to a task requiring a higher amount of computing resources. The task control system can adaptively assign processor cores to achieve the shortest turn-around time for the multi-scale simulation. The task control system can dynamically allocate computing resources by repeating the steps 202, 204, or 206 when appropriate. The task control system can adaptively assign processor cores such that some partial results can be provided first before all simulations are completed. For example, the task control system can execute ¼ of the DFT simulations first, followed by 2D Schrödinger and drift-diffusion device simulations based on results of the ¼ DFT simulations, to provide a set of partial results. Meanwhile, the task control system monitors and determines computing resources for each task of each approach of the multi-scale simulation. The task control system then completes the rest of DFT simulations, followed by corresponding 2D Schrödinger and Drift-diffusion device simulations by adaptively allocating processor cores to the tasks in the multi-scale simulations based on respective computing resources requirement. Meanwhile, the task control system can also adjust input parameters and configurations of the rest of DFT simulations, 2D Schrödinger, or drift-diffusion device simulations based on the set of partial results.

For another example, the task control system can adaptively assign processor cores to achieve the shortest turn-around time for a particular multi-scale simulation approach when results for a set of different input conditions are requested. In this case, the task control system can assign a small amount of compute resources to many short-running tasks while reserving a larger amount of compute resources for the longer-running tasks. Also, while the task control system monitors the compute time of each task of each split, it can dynamically adjust the amount of compute resources as other tasks complete. In addition, as the amount of compute resources is increased for a particular task, the task control system can dynamically determine the effectiveness of the additional compute resources in reducing the runtime of the task and for tasks that are not helped by the additional compute resource, the compute resource can be re-assigned to other tasks. Additionally, if the results of some tasks or approaches indicate that other materials cases slated for evaluation are not likely to have desired results, then the system can proactively terminate the execution of a task or prevent its execution altogether.

Figure 6:
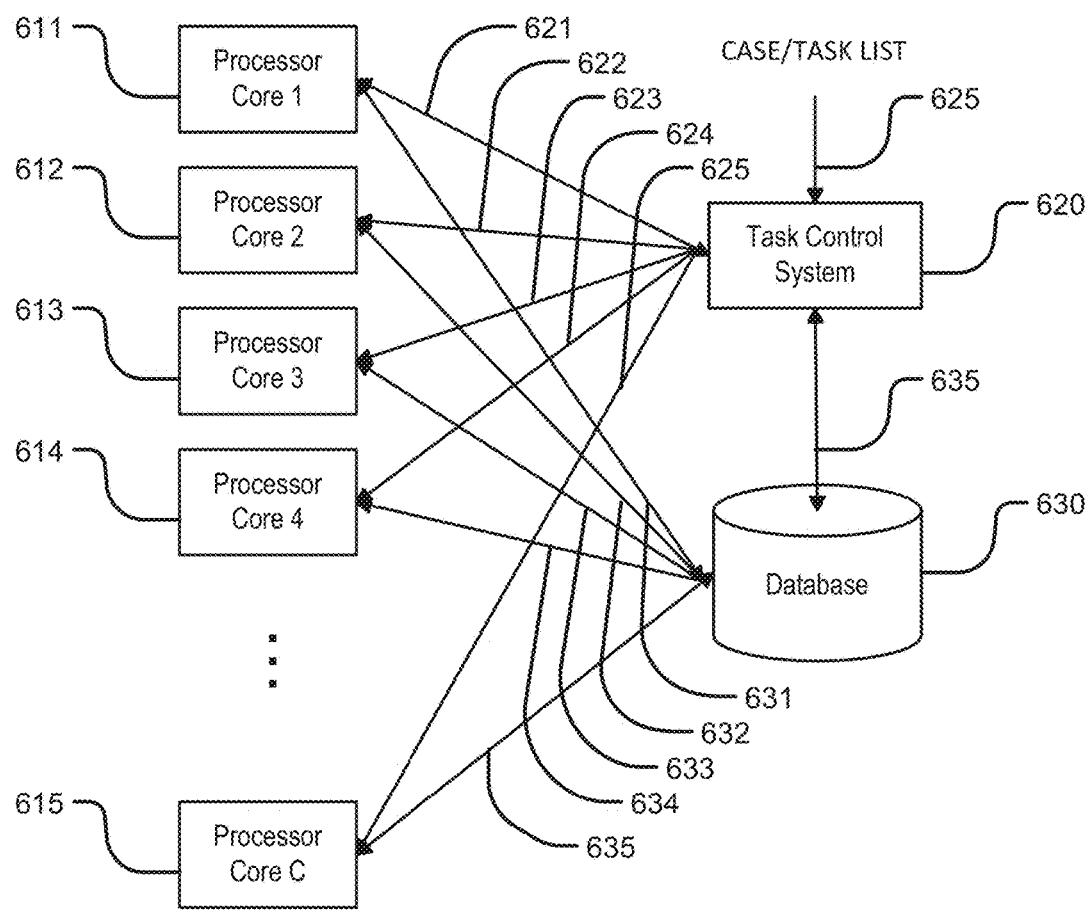
FIG. 6 shows an overall topology of a system for optimizing turnaround time for a multi-scale simulation.

FIG. 6 shows an overall topology of a system for optimizing turnaround time for a multi-scale simulation. The system includes a plurality of processor cores 611-614 . . . 615, a task control system 620, and a database 630. The plurality of processor cores can reside in different workstations, where a workstation can be configured to use one or more processor cores. In some embodiments, processor cores in different workstations can be used in parallel. The number of workstations is less than or equal to the total number cores available. The task control system receives a case/task list as input via a signal path 625. The case/task list can include multiple cases to process, and specify tasks to execute for each case, where each can include one or more tasks. The task control system communicates with the database via a signal path 635.

Figure 7:
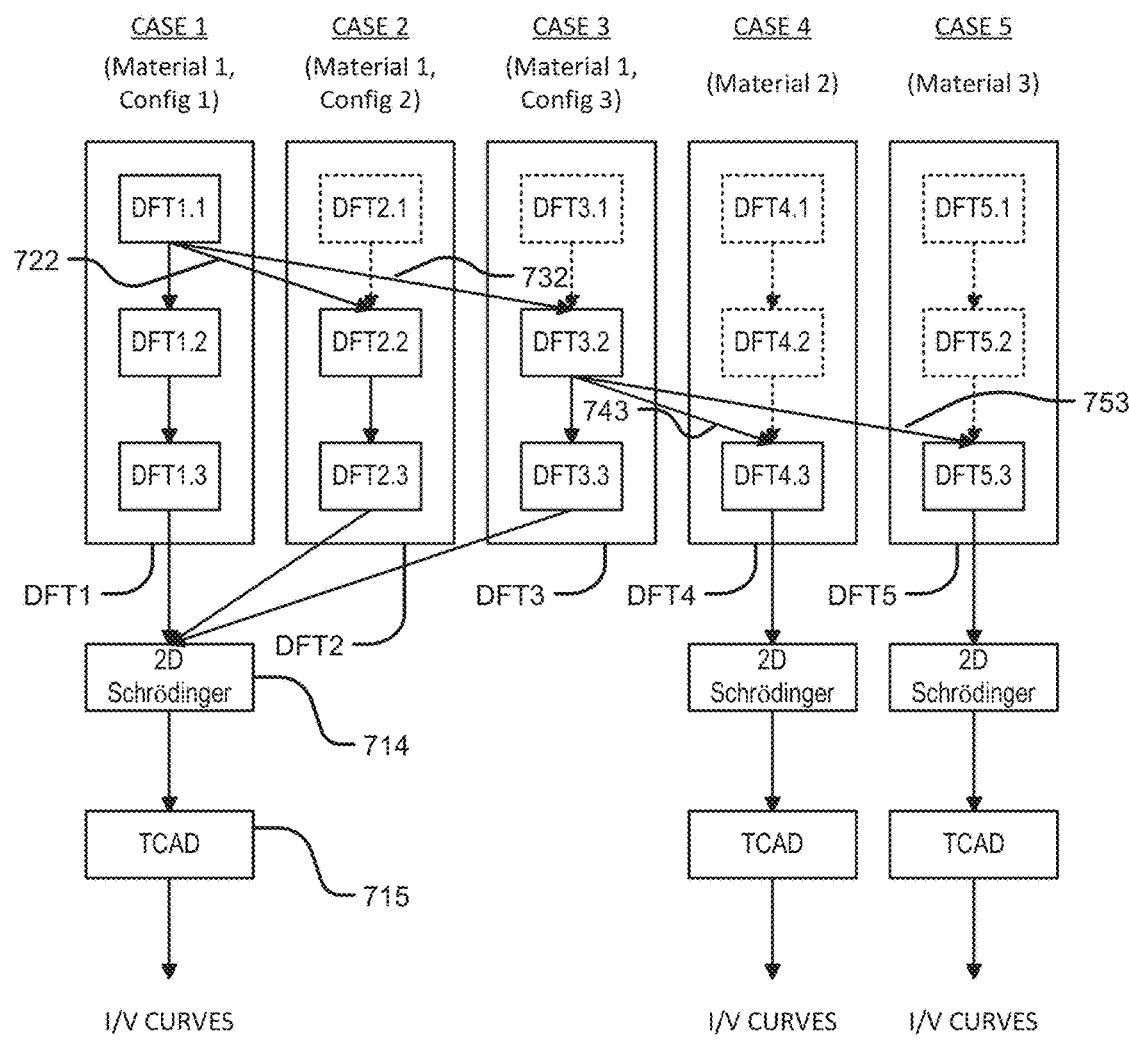
FIG. 7 shows an example case/task list that is input to the task control system in FIG. 6.

A sample case/task list is illustrated in FIG. 7 and described below, but briefly, the sequence of tasks through multiple approaches is intended to produce a result of some kind, for a particular "case" or group of cases. As used herein, a "case" is a specific material, or a specific state of the material such as its lattice configuration. Some types of cases need to be evaluated separately through all the approaches, whereas other types of cases are evaluated separately through early tasks, then merged and evaluated together through the alter tasks or approaches. All this can be delineated in the case/task list.

The task control system 620 can direct tasks for multiple cases to processor cores in the plurality of processor cores on multiple workstations via a set of signal paths 621-625, depending on the amount of computing resources are allocated to each task of each case. The task control system can instruct workstations to initiate the execution of a task, including the number of processor cores to use. After the execution of the task is initiated, the task control system can monitor the execution time of the task. The task control system can also terminate any pending tasks determined to be unpromising, if based on intermediate results from any tasks or sub-tasks, the task control system can determine that the case that those tasks are concerned with is not likely to have desired characteristics.

Processor cores 611-614 . . . 615 can communicate with the database 630 via a set of signal paths 631-635 to obtain their data and write their results, including intermediate results. The database 630 can store starting data, intermediate and final result sets of data from the processor cores and from the task control system.

As used herein, the term "database" does not necessarily imply any unity of structure. For example, two or more separate databases, when considered together, still constitute a "database" as that term is used herein. Thus in FIG. 6, the database 630 can be a combination of two or more separate databases, and may or may not be collocated.

FIG. 7 shows an example case/task list that is input to the task control system in FIG. 6. The example case/task list is for an embodiment aimed at identifying a new material with promising I/V (current vs voltage) curves. For instance, a plurality of cases (e.g. CASE 1, CASE 2, CASE 3, CASE 4, CASE 5) is investigated, where the cases can differ by different materials and/or different crystal lattice configurations. CASE 1 involves configuration 1 of material 1, CASE 2 involves configuration 2 of material 1, while CASE 3 involves configuration 3 of material 1. CASE 4 and CASE 5 involve material 2 and material 3, respectively.

Evaluation of a case involves a sequence of tasks, such as using density functional theory (DFT) calculations, two-dimensional Schrödinger calculations, and TCAD simulations. A task can involve sub-tasks. For example, in FIG. 7, each case begins with a DFT task, and each DFT task (e.g. DFT1) is shown as having three sub-tasks (e.g. DFT1.1, DFT1.2, DFT1.3). The three sub-tasks as shown in each DFT task illustrate there are multiple sub-tasks in a DFT task, not limiting the number of sub-tasks to three. As used herein, sub-tasks are also considered "tasks" in their own right. Similarly, CASE 2, CASE 3, CASE 4 and CASE 5 begin with DFT tasks DFT2, DFT3, DFT4 and DFT5 respectively, and have three sub-tasks for each DFT task.

For instance, the materials silicon germanium (SiGe), gallium arsenide (GaAs) and indium gallium arsenide (InGaAs) are all considered herein to be different materials. Compound materials such as SiGe and InGaAs are alloys of their constituent atoms in which each atom occupies the atomic lattice sites in a relative proportion called the mole fraction. At the atomistic level, the occupied lattice sites for a particular atomic species are randomly distributed. Thus when evaluating such a material the DFT calculation of the electronic band structure typically is performed for an ensemble of atomic structures (configurations in FIG. 7), each with unique placement of the constituent atomic species.

In one embodiment, a first sub-task in DFT tasks DFT1, DFT2 and DFT3 (e.g. DFT1.1, DFT2.1, DFT3.1) can specify initial position of atoms in crystal lattice based on a same material 1 selected for CASE 1, CASE 2 and CASE 3. Calculations using sub-tasks DFT2.1 and DFT3.1 become optional as they produce the same intermediate results as DFT1.1. Sub-tasks DFT2.2 and DFT3.2 of DFT tasks DFT2 and DFT3 can use the results from sub-task DFT1.1 of DFT task DFT1 instead (e.g. 722, 732), and executions of DFT2 and DFT3 can be started after sub-task DFT1.1 completes. Consequently, sub-tasks DFT1.2, DFT2.2 and DFT3.2 are dependent on sub-task DFT1.1, as they use the material 1. Sub-tasks DFT1.3, DFT2.3 and DFT3.3 are dependent on sub-tasks DFT1.2, DFT2.2 and DFT3.2, respectively, as their calculations involve different configurations (e.g. config 1, config 2, config 3).

When executions of DFT tasks DFT1, DFT2 and DFT3 are completed, their results are averaged, weighted by relative probabilities of occurrence of respective configurations, to obtain one result for the material 1, for use in 2D Schrödinger calculations (e.g. 714). The averaged result for the material 1 from the DFT tasks can include masses and valley splittings. 2D Schrödinger calculations (e.g. 714) then compute the carrier density for a particular device geometry. The carrier density is then passed to the next task in TCAD simulations (e.g. 715), to calculate IN curves for a device using the new material.

Depending on the materials and crystal lattice configurations selected, sub-tasks for other DFT task may become optional. For instance, sub-task DFT4.3 of DFT task DFT4 may be dependent on sub-tasks DFT3.2 of DFT task3 (e.g. 743), such that sub-tasks DFT4.1 and DFT4.2 are optional and DFT task DFT4 can be started after DFT3.2 is completed. For instance, sub-task DFT5.3 of DFT task DFT5 may be dependent on sub-tasks DFT3.2 of DFT task3 (e.g. 753), such that sub-tasks DFT5.1 and DFT5.2 become optional and DFT task DFT5 can be started after DFT3.2 is completed. All of these dependency relationships are identified in the case/task list.

Though not shown in FIG. 7, each task has associated therewith an expected time to completion, as a number of core-hours. That expected time gets updated occasionally as the task control system (620, FIG. 6) monitors the processor cores and learns how long tasks are actually taking to complete.

Figure 8:
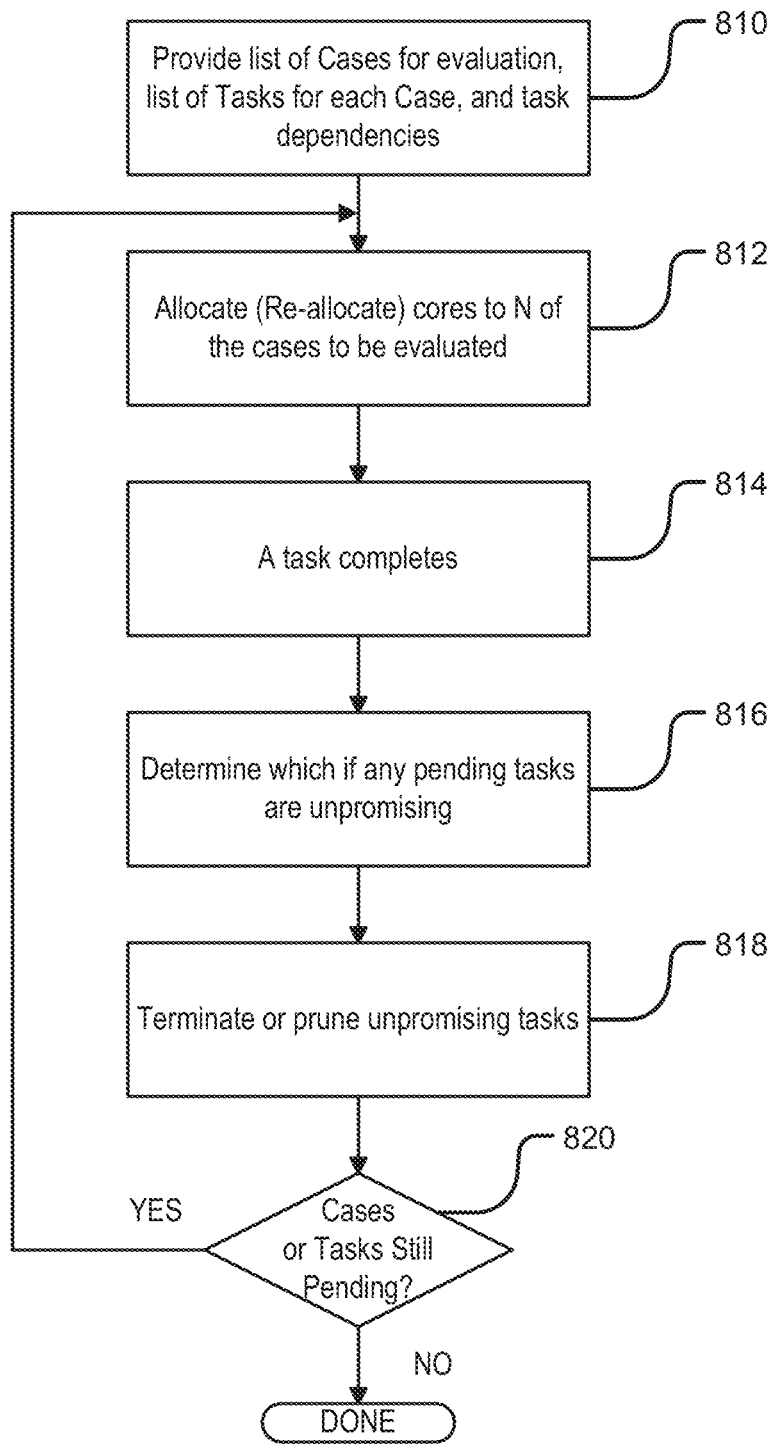
FIG. 8 is a flow chart illustrating an overall methodology of an embodiment of a task control system.

FIG. 8 is a flow chart illustrating an overall methodology of an embodiment. For description of the methodology, let C=total number of processor cores available, and N=maximum number of concurrent tasks that can be run, where N≤C. As examples, assume that each task within DFT requires 50 core-hours to complete, each 2D Schrödinger task requires 16 core-hours to complete, and each TCAD task requires 4 core-hours to complete.

At step 810, a list of cases for evaluation, a list of tasks for each case, and task dependencies are provided to the task control system (620, FIG. 6). At step 812, the task control system allocates $c_i$ processor cores (611-614, . . . 615, FIG.

6) to each i'th task, $1 \leq i \leq N$, where each task can be allocated a different number of cores, but $\Sigma_{i=1}^{N} c_i \leq C$. If a goal is to get a result out of the TCAD task for material 1 (e.g. 715, FIG. 7) as quickly as possible, for example because such a result might, depending on the result, maximally prune the case/task list, then the task control system may in step 812 allocate all available cores to DFT1 (FIG. 7). And after each task completes, the task control system may continue to re-allocate most cores to the tasks of material 1 until the TCAD task completes and the results for material 1 are available. As shown in FIG. 7, the tasks of material 1 can include sub-tasks DFT2.2, DFT2.3, DFT3.2 and DFT3.3, as determined by task dependencies provided to the task control system.

As each task completes (step 814), the task control system determines which, if any, pending tasks have become unpromising such that a desired set of I/V curves is not likely to be generated for a new material even if the pending tasks are executed to completion, based on intermediate results available (step 816). As used herein, a "pending" task includes both tasks which have begun execution but have not yet completed, as well as tasks which have not yet begun execution. If any unpromising tasks are determined, the task control system can terminate any that are already executing, or prune the unpromising tasks that are not yet started (step 818). Not every task or sub-task causes re-allocation of processor cores after the task or sub-task completes. In one embodiment, the task control system only re-allocates processor cores after a TCAD task completes.

Subsequently, the task control system determines if any tasks are still pending (step 820), if so, the task control system returns to step 812 to re-allocate cores if appropriate.

At least three scenarios in re-allocating processor cores are possible in different embodiments. In one embodiment, the task control system may continue allocating processor cores to tasks for material 1, so as to minimize time through the TCAD task for material 1 (e.g. 715, FIG. 7), and get a result as soon as possible, for maximum likelihood of pruning. In another embodiment, the task control system may reduce the number of processor cores allocated to tasks for material 1, and allocate the processor cores that become available as a result of the reduction to start a pending task. In yet another embodiment, the task control system may reduce the number of processor cores allocated to tasks for material 1, and reserve the processor cores that become available until sufficient numbers of available cores are accumulated to start a pending task efficiently. Other scenarios will be apparent to one of ordinary skill in the art.

In response to the completion of a particular task, the task control system can re-allocate available processor cores to at least some of the pending not-yet-executing tasks in accordance with time required to complete the tasks and constrained by the task dependencies, and to initiate execution of the tasks on allocated cores. The task control system can calculate and update time-to-completion of each task or type of task. In re-allocation of processor cores (step 812), the task control system can take into account the (updated) expected time-to-completion of each task. The task control system can take into account the task dependencies. For example, when the task control system has processor cores available for allocation, the task control system does not start a task whose prerequisite tasks have not yet completed, but instead chooses to start a different task whose prerequisite tasks have been completed to start, or allocates more cores to other newly starting tasks.

In one embodiment, once a task is allocated a particular number of cores and begins executing, cores can neither be added nor removed while the task is executing. If a change is desired, the task has to stop and re-start on the revised number of cores. In another embodiment the number of cores on which a task is executing can be changed dynamically during execution.

Note that the specific approaches used in the illustrations of FIGS. 1 and 7 (DFT, 2D Schrödinger, and TCAD) are only examples of a variety of different approaches that might be involved in a particular multi-scale simulation. Techniques according to the invention can also be used for a variety of other multi-scale simulation problems. For the most computationally intensive approach in FIG. 7, for example, any of a class of approaches known as "ab initio" or "first principles" approaches might be used. DFT is an example of such an approach. These approaches require minimal empirical input to generate accurate ground state total energies for arbitrary configurations of atoms. They make use of the most fundamental governing quantum mechanical equations, and require very little in the way of externally-supplied materials parameters. This capability makes these methods well-suited to investigating new materials and to providing highly detailed physical insight into materials properties and processes, but also render them extremely compute intensive. As such, a task control system according to the invention might control a multi-scale simulation project in which any of the ab initio approaches are used in combination with less compute intensive approaches such as 2D Schrödinger and TCAD. As used herein, an "ab initio" or "first principles" analysis approach or module is an approach or module that develops its results at least in part by solving Schrödinger's equation based on positions and types of atoms. Other example first principles approaches that can be used herein include EPM (Empirical Pseudopotential Method) tools, and ETB (Empirical Tight Binding) tools, and combinations of approaches.

Similarly, for the least computationally intensive approach in FIG. 7, other approaches might be used other than Drift-Diffusion include NEGF (Non-Equilibrium Green's Function) and BTE (Boltzmann Transport Equation). These methods also take results from the 2D Schrödinger solver to produce current-voltage curves like Drift-Diffusion. For NEGF, the sequence involves computing carrier density and NEGF transport matrix from the 2D Schrödinger calculation, and then performing NEGF device simulation to compute current. For BTE, the sequence involves computing carrier density and scattering rates from the 2D Schrödinger calculation, and performing BTE device simulation to compute current. Other variations will be apparent.

The logic of FIG. 8 can be implemented using processors programmed using computer programs stored in memory accessible to the computer systems and executable by the processors, by dedicated logic hardware, including field programmable integrated circuits, or by combinations of dedicated logic hardware and computer programs. Each block in the flowchart describes logic that can be implemented in hardware or in software running on one or more computing processes executing on one or more computer systems. In one embodiment, each step of the flow chart illustrates the function of a separate module of software. In another embodiment, the logic of the step is performed by software code routines which are distributed throughout more than one module. As with all flowcharts herein, it will be appreciated that many of the steps can be combined, performed in parallel or performed in a different sequence without affecting the functions achieved. In some cases, as the reader will appreciate, a re-arrangement of steps will achieve the same results only if certain other changes are made as well. In other cases, as the reader will appreciate, a re-arrangement of steps will achieve the same results only if certain conditions are satisfied. Furthermore, it will be appreciated that the flow charts herein show only steps that are pertinent to an understanding of the invention, and it will be understood that in a specific embodiment, numerous additional steps for accomplishing other functions for that embodiment can be performed before, after and between those steps shown.

Hardware

Figure 3:
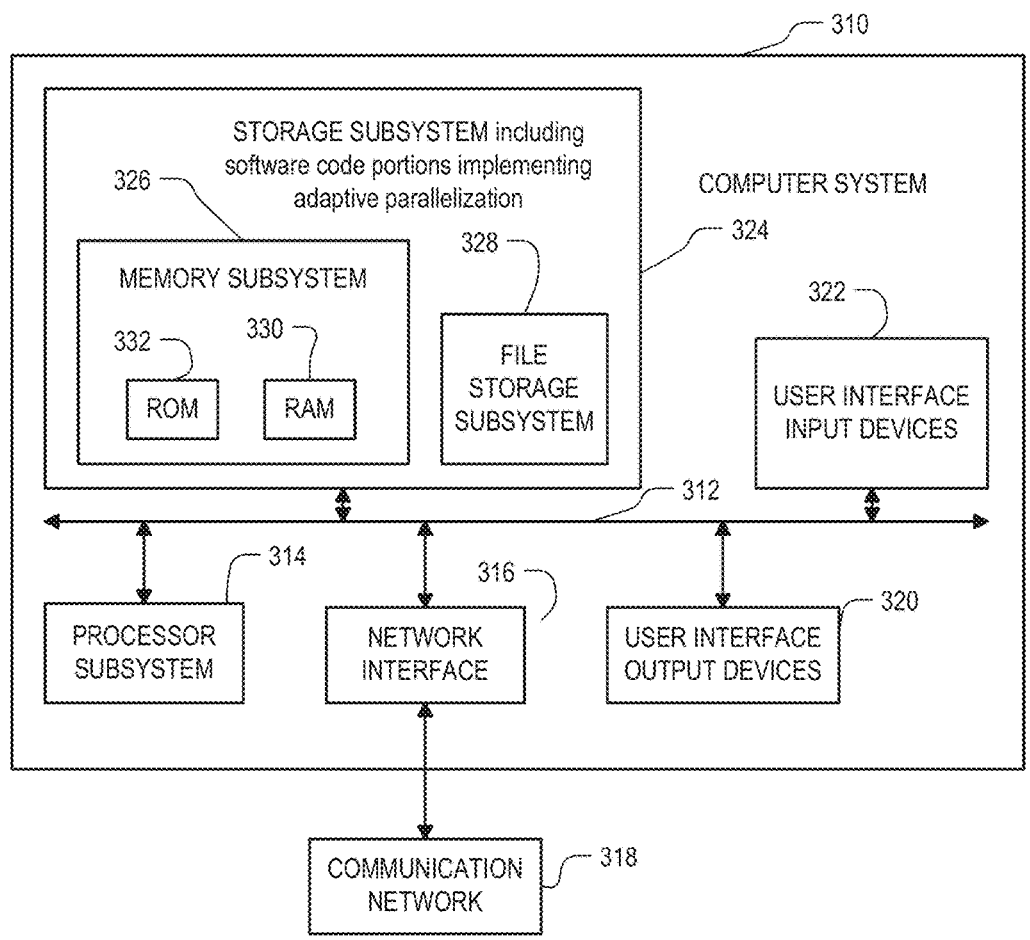
FIG. 3 is a simplified block diagram of a computer system that can be used to implement any of the methods and processes herein.

FIG. 3 is a simplified block diagram of a computer system 310 that can be used to implement any of the methods and processes herein. For example, the task control system 620 and each of the workstations having the cores 611, 612, 613, 614, . . . , 615, can be implemented on one or more computer systems 310. For example, the method for optimizing turn-around time for a multi-scale simulation illustrated in FIG. 2 can be implemented with one or more programs executing on one or more computer systems 310.

Computer system 310 typically includes a processor subsystem 314 which communicates with a number of peripheral devices via bus subsystem 312. These peripheral devices may include a storage subsystem 324, comprising a memory subsystem 326 and a file storage subsystem 328, user interface input devices 322, user interface output devices 320, and a network interface subsystem 316. The input and output devices allow user interaction with computer system 310. Network interface subsystem 316 provides an interface to outside networks, including an interface to communication network 318, and is coupled via communication network 318 to corresponding interface devices in other computer systems. Communication network 318 may comprise many interconnected computer systems and communication links. These communication links may be wireline links, optical links, wireless links, or any other mechanisms for communication of information, but typically it is an IP-based communication network. While in one embodiment, communication network 318 is the Internet, in other embodiments, communication network 318 may be any suitable computer network.

The physical hardware component of network interfaces are sometimes referred to as network interface cards (NICs), although they need not be in the form of cards: for instance they could be in the form of integrated circuits (ICs) and connectors fitted directly onto a motherboard, or in the form of macrocells fabricated on a single integrated circuit chip with other components of the computer system.

User interface input devices 322 may include a keyboard, pointing devices such as a mouse, trackball, touchpad, or graphics tablet, a scanner, a touch screen incorporated into the display, audio input devices such as voice recognition systems, microphones, and other types of input devices. In general, use of the term "input device" is intended to include all possible types of devices and ways to input information into computer system 310 or onto computer network 318.

User interface output devices 320 may include a display subsystem, a printer, a fax machine, or non-visual displays such as audio output devices. The display subsystem may include a cathode ray tube (CRT), a flat-panel device such as a liquid crystal display (LCD), a projection device, or some other mechanism for creating a visible image. The display subsystem may also provide non-visual display such as via audio output devices. In general, use of the term "output device" is intended to include all possible types of devices and ways to output information from computer system 310 to the user or to another machine or computer system.

Storage subsystem 324 stores the basic programming and data constructs that provide the functionality of certain embodiments of the present invention. For example, the various modules implementing the functionality of certain embodiments of the invention may be stored in storage subsystem 324. These software modules are generally executed by processor subsystem 314. The database 630, in one embodiment, is stored on a computer readable medium in storage subsystem 324 of task control system 635. In another embodiment database 630 is located in a separate computer system accessible to task control system 620 and each of the workstations via a network such as 318. Many other variations will be apparent.

Memory subsystem 326 typically includes a number of memories including a main random access memory (RAM) 330 for storage of instructions and data during program execution and a read only memory (ROM) 332 in which fixed instructions are stored. File storage subsystem 328 provides persistent storage for program and data files, and may include a hard disk drive, a floppy disk drive along with associated removable media, a CD ROM drive, an optical drive, or removable media cartridges. The databases and modules implementing the functionality of certain embodiments of the invention may have been provided on a computer readable medium such as one or more CD-ROMs, and may be stored by file storage subsystem 328. The host memory 326 contains, among other things, computer instructions which, when executed by the processor subsystem 314, cause the computer system to operate or perform functions as described herein. As used herein, processes and software that are said to run in or on "the host" or "the computer", execute on the processor subsystem 314 in response to computer instructions and data in the host memory subsystem 326 including any other local or remote storage for such instructions and data.

Bus subsystem 312 provides a mechanism for letting the various components and subsystems of computer system 310 communicate with each other as intended. Although bus subsystem 312 is shown schematically as a single bus, alternative embodiments of the bus subsystem may use multiple busses.

Computer system 310 itself can be of varying types including a personal computer, a portable computer, a workstation, a computer terminal, a network computer, a television, a mainframe, a server farm, or any other data processing system or user device. Due to the ever-changing nature of computers and networks, the description of computer system 310 depicted in FIG. 3 is intended only as a specific example for purposes of illustrating the preferred embodiments of the present invention. Many other configurations of computer system 310 are possible having more or less components than the computer system depicted in FIG. 3.

In addition, while the present invention has been described in the context of a fully functioning data processing system, those of ordinary skill in the art will appreciate that the processes herein are capable of being distributed in the form of a computer readable medium of instructions and data and that the invention applies equally regardless of the particular type of signal bearing media actually used to carry out the distribution. As used herein, a computer readable medium is one on which information can be stored and read by a computer system. Examples include a floppy disk, a hard disk drive, a RAM, a CD, a DVD, flash memory, a USB drive, and so on. The computer readable medium may store information in coded formats that are decoded for actual use in a particular data processing system. A single computer readable medium, as the term is used herein, may also include more than one physical item, such as a plurality of CD ROMs or a plurality of segments of RAM, or a combination of several different kinds of media. As used herein, the term "computer readable medium" does not include mere time varying signals in which the information is encoded in the way the signal varies over time.

Overall Design Process Flow

Figure 4:
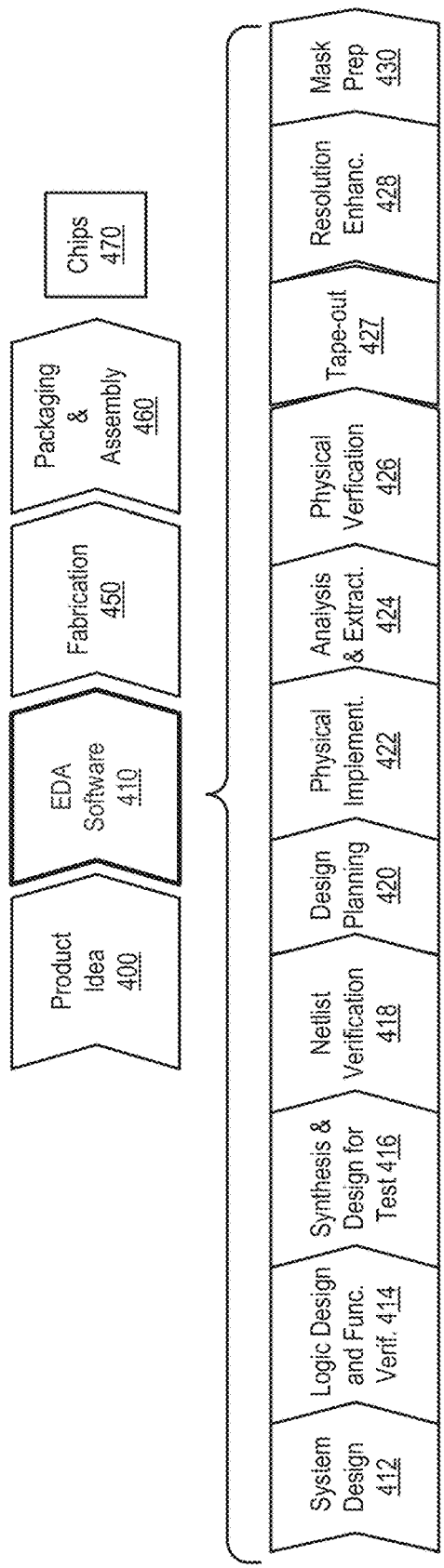
FIG. 4 shows a simplified representation of an illustrative digital integrated circuit design flow.

Aspects of the invention can be used to support an integrated circuit design flow. FIG. 4 shows a simplified representation of an illustrative digital integrated circuit design flow. At a high level, the process starts with the product idea (step 400) and is realized in an EDA (Electronic Design Automation) software design process (step 410). When the design is finalized, it can be taped-out (step 427). At some point after tape out, the fabrication process (step 450) and packaging and assembly processes (step 460) occur resulting, ultimately, in finished integrated circuit chips (result 470).

The EDA software design process (step 410) is itself composed of a number of steps 412-430, shown in linear fashion for simplicity. In an actual integrated circuit design process, the particular design might have to go back through steps until certain tests are passed. Similarly, in any actual design process, these steps may occur in different orders and combinations. This description is therefore provided by way of context and general explanation rather than as a specific, or recommended, design flow for a particular integrated circuit.

A brief description of the component steps of the EDA software design process (step 410) will now be provided.

System design (step 412): The designers describe the functionality that they want to implement, they can perform what-if planning to refine functionality, check costs, etc. Hardware-software architecture partitioning can occur at this stage. Example EDA software products from Synopsys, Inc. that can be used at this step include Model Architect, Saber, System Studio, and DesignWare® products.

Logic design and functional verification (step 414): At this stage, the VHDL or Verilog code for modules in the system is written and the design is checked for functional accuracy. More specifically, the design is checked to ensure that it produces correct outputs in response to particular input stimuli. Example EDA software products from Synopsys, Inc. that can be used at this step include VCS, VERA, DesignWare®, Magellan, Formality, ESP and LEDA products.

Synthesis and design for test (step 416): Here, the VHDL/Verilog is translated to a netlist. The netlist can be optimized for the target technology. Additionally, the design and implementation of tests to permit checking of the finished chip occurs. Example EDA software products from Synopsys, Inc. that can be used at this step include Design Compiler®, Physical Compiler, DFT Compiler, Power Compiler, FPGA Compiler, TetraMAX, and DesignWare® products.

Netlist verification (step 418): At this step, the netlist is checked for compliance with timing constraints and for correspondence with the VHDL/Verilog source code. Example EDA software products from Synopsys, Inc. that can be used at this step include Formality, PrimeTime, and VCS products.

Design planning (step 420): Here, an overall floor plan for the chip is constructed and analyzed for timing and top-level routing. Example EDA software products from Synopsys, Inc. that can be used at this step include Astro and Custom Designer products.

Physical implementation (step 422): The placement (positioning of circuit elements) and routing (connection of the same) occurs at this step, as can selection of library cells to perform specified logic functions. Example EDA software products from Synopsys, Inc. that can be used at this step include the Astro, IC Compiler, and Custom Designer products.

Analysis and extraction (step 424): At this step, the circuit function is verified at a transistor level, this in turn permits what-if refinement. Example EDA software products from Synopsys, Inc. that can be used at this step include AstroRail, PrimeRail, PrimeTime, and Star-RCXT products.

Physical verification (step 426): At this step various checking functions are performed to ensure correctness for: manufacturing, electrical issues, lithographic issues, and circuitry. Example EDA software products from Synopsys, Inc. that can be used at this step include the Hercules product.

Tape-out (step 427): This step provides the "tape-out" data to be used (after lithographic enhancements are applied if appropriate) for production of masks for lithographic use to produce finished chips. Example EDA software products from Synopsys, Inc. that can be used at this step include the IC Compiler and Custom Designer families of products.

Resolution enhancement (step 428): This step involves geometric manipulations of the layout to improve manufacturability of the design. Example EDA software products from Synopsys, Inc. that can be used at this step include Proteus, ProteusAF, and PSMGen products.

Mask data preparation (step 430): This step provides mask-making-ready "tape-out" data for production of masks for lithographic use to produce finished chips. Example EDA software products from Synopsys, Inc. that can be used at this step include the CATS(R) family of products.

Parallel Flow

The integrated circuit manufacturing flow includes a parallel flow, as follows:

(1) Identify a new set of materials for transistor and device fabrication. Such new materials may be sought because they work better or are easier to fabricate at very small dimensions, or otherwise offer better characteristics or more niche characteristics than conventional materials. Multi-scale simulations optimized for turnaround time substantially as described herein can be used in this step, for example.

(2) Develop individual process steps for manufacturing the integrated circuit. This can be modeled with EDA tools such as the Synopsys tools "Sentaurus Process", "Sentaurus Topography", and "Sentaurus Lithography". The input information here is the process conditions like temperature, reactor ambient, implant energy, etc. The output information is the change in geometry or doping profiles or stress distribution.

(3) Integrate the individual process steps into the complete process flow. This can be modeled with EDA tools such as the Synopsys tool "Sentaurus Process". The input information here is the collection of the process steps in the appropriate sequence. The output is the geometry, the doping profiles, and the stress distribution for the transistors and the space in between the transistors.

(4) Analyze performance of the transistor manufactured with this process flow. This can be done with EDA tools such as the Synopsys tool "Sentaurus Device". The input information here is the output of step (3) and the biases applied to transistor terminals. The output information is the currents and capacitances for each bias combination.

(5) If necessary, modify the process steps and the process flow to achieve the desired transistor performance. This can be done iteratively by using tools such as the Synopsys tools mentioned above.

Once the process flow is ready, it can be used for manufacturing multiple circuit designs coming from different fabless companies. The EDA flow 412-430 will be used by such fabless companies. The parallel flow described here is used at a foundry to develop a process flow that can be used to manufacture designs coming from their fabless customers. A combination of the process flow and the masks 430 are used to manufacture any particular circuit. If the integrated circuit is manufactured at an IDM (integrated device manufacturer) company instead of the combination of a fables company and a foundry, then both parallel flows described above are done at the same IDM company.

Circuit Simulator

Figure 5:
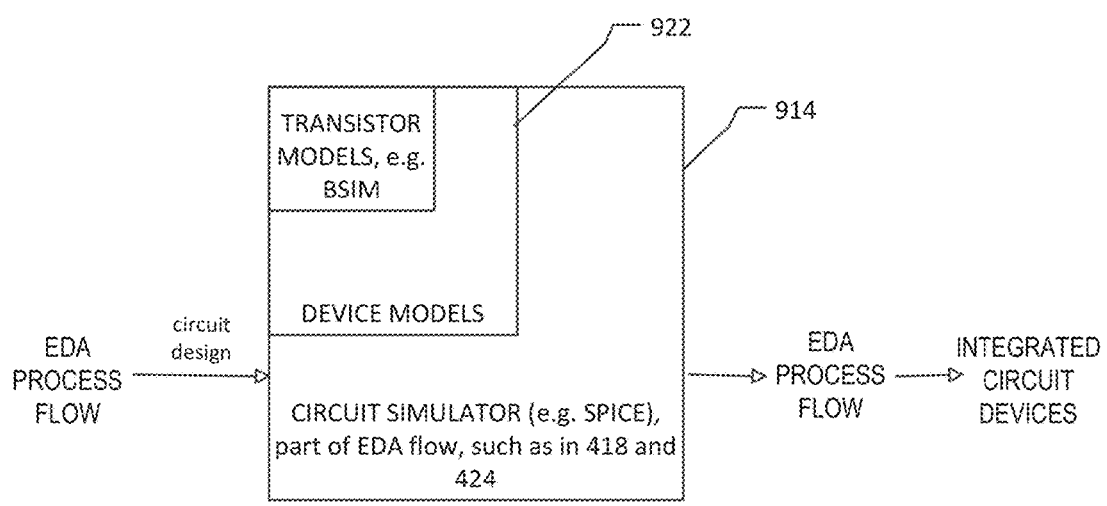
FIG. 5 shows a circuit simulator used in steps of the illustrative digital integrated circuit design flow in FIG. 4.

Circuit simulators are well known. Examples of such tools are different versions of SPICE, described in the following documents incorporated by reference herein: Nagel and Pederson, SPICE (Simulation Program with Integrated Circuit Emphasis), EECS Department, University of California, Berkeley (1973) (available at http://www.eecs.berkeley.edu/Pubs/TechRpts/1973/ERL-382.pdf, visited 2013 Oct. 2); Nagel, Laurence W., SPICE2: A Computer Program to Simulate Semiconductor Circuits, EECS Department, University of California, Berkeley (1975) (available at http://www.eecs.berkeley.edu/Pubs/TechRpts/1975/ERL-520.pdf, visited 2013 Oct. 2); and Quarles, Thomas L., Analysis of Performance and Convergence Issues for Circuit Simulation, EECS Department, University of California, Berkeley (1989) (available at http://www.eecs.berkeley.edu/Pubs/TechRpts/1989/ERL-89-42.pdf, visited 2013 Oct. 2), all incorporated by reference herein. Roughly described, a circuit simulator takes a circuit design as input (typically in the form of a netlist, indicating each component of the circuit and the network by which they are interconnected), and calculates a variety of kinds of information about the circuit. In the embodiment of FIG. 5, the circuit simulator 914 is used for example in steps 418 and/or 424 of the typical EDA flow in FIG. 4 discussed herein.

Circuit simulators such as SPICE include device models 922, which model the behavior of the various components that are used in a circuit. One example device model which is commonly used for transistors is the Berkeley Short-channel IGFET Model (BSIM) family of models. The BSIM4 version of the model is described for example in Mohan V. Dunga et al., BSIM4.6.0 MOSFET Model User's Manual, Department of Electrical Engineering and Computer Sciences, University of California, Berkeley (2006), incorporated by reference herein. The device model 922 can incorporate electrical characteristics generated by the TCAD multi-scale simulation described in FIG. 1 and by the Sentaurus Device tool described herein.

As used herein, a given event or value is "responsive" to a predecessor event or value if the predecessor event or value influenced the given event or value. If there is an intervening processing element, step or time period, the given event or value can still be "responsive" to the predecessor event or value. If the intervening processing element or step combines more than one event or value, the signal output of the processing element or step is considered "responsive" to each of the event or value inputs. If the given event or value is the same as the predecessor event or value, this is merely a degenerate case in which the given event or value is still considered to be "responsive" to the predecessor event or value. "Dependency" of a given event or value upon another event or value is defined similarly.

As used herein, the "identification" of an item of information does not necessarily require the direct specification of that item of information. Information can be "identified" in a field by simply referring to the actual information through one or more layers of indirection, or by identifying one or more items of different information which are together sufficient to determine the actual item of information. In addition, the term "indicate" is used herein to mean the same as "identify".

The applicant hereby discloses in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicant indicates that aspects of the present invention may consist of any such feature or combination of features.

In particular and without limitation, though many of the inventive aspects are described individually herein, it will be appreciated that many can be combined or used together with each other. All such combinations are intended to be included in the scope of this document.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. In particular, and without limitation, any and all variations described, suggested or incorporated by reference herein with respect to any one embodiment are also to be considered taught with respect to all other embodiments. The embodiments described herein were chosen and described in order to best explain the principles of the invention and its practical application, thereby enabling others skilled in the art to understand the invention for various embodiments and with various modifications as are suited to the particular use contemplated.

The invention claimed is:

1. A task control system for managing multi-scale simulations of material cases for use in semiconductor technology, comprising:

a data processor;

storage accessible to the processor and including code portions which when executed by the processor cause the processor to perform the steps of:

receiving a case/task list for a multi-scale simulation in which a task at one simulation scale produces an output to be applied as an input to a task at a different simulation scale, the case/task list identifying a plurality of cases to be evaluated, at least one task for each of the cases, and dependencies among the tasks, each of the cases defining a material and a state of the material and differing from all of the other cases in either the material or the material state or both, the material being for use in semiconductor technology, and the case/task list further identifying, for a subject one of the material cases, at least two tasks of different approaches of the multi-scale simulation including a first approach using Density Functional Theory calculations and a second approach being a non-ab initio approach, the case/task list including at least one instance in which a task of the second approach follows a task of the first approach;

allocating available processor cores to at least some of the tasks, constrained by the dependencies, and to initiate execution of the tasks on allocated cores;

in response to completion of a particular one of the tasks of a particular one of the cases, the particular task generating a result, making a determination as to whether or not the result indicates that the particular case is not likely to have predetermined characteristics, and if the determination is that the result indicates that the particular case is not likely to have the predetermined characteristics, then terminating or pruning one or more of uncompleted tasks in the case/task list; and further in response to the completion of the particular task, re-allocating available processor cores to at least some of the pending not-yet-executing tasks in accordance with time required to complete the tasks and constrained by the dependencies, and to initiate execution of the tasks on allocated cores, wherein each of the material cases differs from all others of the material cases at least by its internal content or internal configuration.

2. The system of claim 1, wherein the case/task list further identifies, for the subject material case, a third task of a third approach of the multi-scale simulation.

3. The system of claim 2, wherein the third approach includes two-dimensional Schrödinger calculations.

4. The system of claim 2, wherein the third approach includes Empirical Pseudo-potential calculations.

5. The system of claim 2, wherein the third approach includes Empirical Tight Binding calculations.

6. The system of claim 1, wherein the non-ab initio approach includes drift-diffusion calculations.

7. The system of claim 1, wherein the non-ab initio approach includes Non-Equilibrium Green's Function calculations.

8. The system of claim 1, wherein the non-ab initio approach includes Boltzmann Transport Equation calculations.

9. The system of claim 1, wherein results of the multi-scale simulation comprise one or more electrical characteristics of a modeled semiconductor device.

10. The system of claim 1, wherein allocating available processor cores operates at least in part based on turnaround time of a particular task of the multi-scale simulation.

11. A method for optimizing turnaround time for a multi-scale simulation of material cases for use in semiconductor technology, comprising the steps of:

a computer system receiving a case/task list for a multi-scale simulation in which a task at one simulation scale produces an output to be applied as an input to a task at a different simulation scale, the case/task list identifying a plurality of cases to be evaluated, at least one task for each of the cases, and dependencies among the tasks, each of the cases defining a material being evaluated for use in semiconductor technology, and each of the cases further defining a state of the material and differing from all of the other cases in either the material or the material state or both, and the case/task list further identifying, for a subject one of the material cases, at least two tasks of different approaches of the multi-scale simulation including a first approach using Density Functional Theory calculations and a second approach being a non-ab initio approach, the case/task list including at least one instance in which a task of the second approach follows a task of the first approach;

the computer system allocating available processor cores to at least some of the tasks, constrained by the dependencies, and initiating execution of the tasks on allocated cores;

in response to completion of a particular one of the tasks of a particular one of the cases, the particular task generating a result, making a determination as to whether or not the result indicates that the particular case is not likely to have predetermined characteristics, and if the determination is that the result indicates that the particular case is not likely to have the predetermined characteristics, then terminating or pruning one or more of uncompleted tasks in the case/task list; and further in response to the completion of the particular task, re-allocating available processor cores to at least some of the pending not-yet-executing tasks in accordance with time required to complete the tasks and constrained by the dependencies, and initiating execution of the tasks on allocated cores, wherein each of the material cases differs from all others of the material cases at least by its internal content or internal configuration.

12. A computer readable medium having stored thereon in a non-transitory manner, a plurality of software code portions defining logic for optimizing turnaround time for a multi-scale simulation of material cases for use in semiconductor technology, including logic for:

allocating available processor cores to at least some of the tasks of a case/task list for a multi-scale simulation in which a task at one simulation scale produces an output to be applied as an input to a task at a different simulation scale, the case/task list identifying a plurality of cases to be evaluated, at least one task for each of the cases, and dependencies among the tasks, each of the cases defining a material and a state of the material, each of the materials being for use in semiconductor technology, each of the cases and differing from all of the other cases in either the material or the material state or both, and the case/task list further identifying, for a subject one of the material cases, at least two tasks of different approaches of the multi-scale simulation including a first approach using Density Functional Theory calculations and a second approach being a non-ab initio approach, the case/task list including at least one instance in which a task of the second approach follows a task of the first approach;

initiating execution of the tasks on allocated cores;

in response to completion of a particular one of the tasks of a particular one of the cases, the particular task generating a result, making a determination as to whether or not the result indicates that the particular case is not likely to have predetermined characteristics, and if the determination is that the result indicates that the particular case is not likely to have the predetermined characteristics, then terminating or pruning one or more of uncompleted tasks in the case/task list; and further in response to the completion of the particular task, re-allocating available processor cores to at least some of the pending not-yet-executing tasks in accordance with time required to complete the tasks and constrained by the dependencies, and initiating execution of the tasks on allocated cores, wherein each of the material cases differs from all others of the material cases at least by its internal content or internal configuration.

13. The computer readable medium of claim 12, wherein the case/task list further identifies, for the subject material case, a third task of a third approach of the multi-scale simulation.

14. The computer readable medium of claim 13, wherein the third approach includes two-dimensional Schrödinger calculations.

15. The computer readable medium of claim 13, wherein the third approach includes Empirical Pseudo-potential calculations.

16. The computer readable medium of claim 13, wherein the third approach includes Empirical Tight Binding calculations.

17. The computer readable medium of claim 12, wherein the non-ab initio approach includes drift-diffusion calculations.

18. The computer readable medium of claim 12, wherein the non-ab initio approach includes Non-Equilibrium Green's Function calculations.

19. The computer readable medium of claim 12, wherein the non-ab initio approach includes Boltzmann Transport Equation calculations.

20. The computer readable medium of claim 12, wherein results of the multi-scale simulation comprise one or more electrical characteristics of a modeled semiconductor device.

21. The computer readable medium of claim 12, wherein allocating available processor cores operates at least in part based on turnaround time of a particular task of the multi-scale simulation.

* * * * *